(12) United States Patent
Taylor

(10) Patent No.: US 7,209,074 B2
(45) Date of Patent: Apr. 24, 2007

(54) TEMPERATURE COMPENSATION IMPROVEMENTS IN RADAR APPARATUS

(75) Inventor: Brian Keith Taylor, Tamworth (GB)

(73) Assignee: TRW Limited (GB)

( * ) Notice: Subject to any disclaimer, the term of this patent is extended or adjusted under 35 U.S.C. 154(b) by 0 days.

(21) Appl. No.: 11/155,932

(22) Filed: Jun. 17, 2005

(65) Prior Publication Data
US 2006/0007037 A1    Jan. 12, 2006

Related U.S. Application Data

(63) Continuation of application No. PCT/GB03/005553, filed on Dec. 18, 2003.

(30) Foreign Application Priority Data
Dec. 19, 2002  (GB)  ............................. 0229515.2

(51) Int. Cl.
*G01S 7/40* (2006.01)
*G01S 13/08* (2006.01)
(52) U.S. Cl. ................ 342/173; 342/174; 342/128; 342/134
(58) Field of Classification Search ............ 342/70–72, 342/82–84, 118, 128, 134, 135, 173, 174
See application file for complete search history.

(56) References Cited

U.S. PATENT DOCUMENTS 4,302,731 A * 11/1981 Ashida ................ 331/116 R
4,454,483 A *  6/1984 Baylor ..................... 331/11

(Continued)

FOREIGN PATENT DOCUMENTS

EP    0 508 765    10/1992

JP    2002/181924    1/1997
JP    10-197625    12/2000

OTHER PUBLICATIONS

"A digital signal-processing technique for compensating ultrasonic sensors", Sabatini, A.M.; Instrumentation and Measurement, IEEE Transactions on vol. 44, Issue 4, Aug. 1995 pp. 869-874.*
Woo C et al.: "A frequency agile X-band homodyne GaAs MMIC transceiver with a synthesized phase locked source for automotive collision avoidance radar"; Microwave And Millimeter-Wave Monolithic Circuits Symposium, 1994. Digest of Papers, IEEE 1994 San Diego, CA USA May 22-25, 1994, New York, NY USA, IEEE, May 22, 1994, pp. 129-132, XP010117693 ISBN: 0-7803-1418-2 the whole document.

*Primary Examiner*—John B. Sotomayor
(74) *Attorney, Agent, or Firm*—MacMillan, Sobanski & Todd, LLC

(57) ABSTRACT

A radar-based distance measurement apparatus comprises a microwave circuit comprising a frequency generator which produces a microwave frequency signal, the frequency of which is modulated by an amount determined by a modulation signal applied to the frequency generator, a temperature sensor which measures the temperature of at least a part of the microwave circuit, compensating means for processing the output of the temperature sensor to produce a compensated temperature signal using information derived from the drive signal and an echo signal detected by a microwave detector; and a frequency regulating means which is adapted to receive the compensated temperature signal and to regulate the frequency of the signal generated by the frequency generator, thereby at least partially correcting for the effect of changes in temperature of the frequency generator. Because the compensating means modifies the output of the temperature sensor in a closed loop using information derived from an echo signal, the frequency regulating means can regulate the frequency output by the frequency generator—keeping it as close as possible to an ideal constant value—despite changes in its temperature.

11 Claims, 2 Drawing Sheets

U.S. PATENT DOCUMENTS

| | | | |
|---|---|---|---|
| 4,558,248 A * | 12/1985 | Valentin | 310/315 |
| 4,593,241 A * | 6/1986 | Eulenberg et al. | 323/294 |
| 5,232,063 A * | 8/1993 | Stoller | 177/210 FP |
| 5,237,332 A * | 8/1993 | Estrick et al. | 342/174 |
| 5,892,408 A * | 4/1999 | Binder | 331/44 |
| 6,140,976 A * | 10/2000 | Locke et al. | 343/853 |
| 6,317,076 B1 | 11/2001 | Ameen et al. | 342/174 |
| 6,545,634 B1 * | 4/2003 | Heide et al. | 342/128 |
| 6,707,419 B2 * | 3/2004 | Woodington et al. | 342/200 |
| 6,903,679 B2 * | 6/2005 | Hanson et al. | 342/91 |
| 2002/0005765 A1 * | 1/2002 | Ashley et al. | 331/176 |
| 2002/0075178 A1 | 6/2002 | Woodington et al. | 342/27 |
| 2002/0093640 A1 * | 7/2002 | Watanabe et al. | 356/5.01 |
| 2003/0193430 A1 * | 10/2003 | Gresham et al. | 342/70 |
| 2006/0007037 A1 * | 1/2006 | Taylor | 342/103 |
| 2006/0079749 A1 * | 4/2006 | Hurst et al. | 600/407 |
| 2006/0164295 A1 * | 7/2006 | Focke et al. | 342/174 |

* cited by examiner

TEMPERATURE COMPENSATION IMPROVEMENTS IN RADAR APPARATUS

CROSS REFERENCE TO RELATED APPLICATIONS

This application is a continuation of International Application No. PCT/GB2003/005553 filed Dec. 18, 2003, the disclosures of which are incorporated herein by reference, and which claimed priority to Great Britain Patent Application No. 0229515.2 filed Dec. 19, 2002, the disclosures of which are incorporated herein by reference.

BACKGROUND OF THE INVENTION

This invention relates to improvements in radar apparatus using microwave frequency components, and in particular to a radar circuit, which incorporates temperature compensation for microwave components.

It is known to use radar in the measurement of distance. In one application radiation in the microwave region of the spectrum is emitted from a source towards a target. The target will reflect some of this radiation back towards a detector, which is sensitive to radiation in the microwave region of the spectrum. An electronic circuit, which may include a digital signal processor, is then used to make a comparison between the emitted signal and the measured, detected, signal from which the range of the target from the source/detector can be estimated.

It is known to provide a frequency shift key scheme to determine the range from the signals. In a vehicle application, where the "targets" are other vehicles, which precede the vehicle to which the radar apparatus is fitted, observations are made of the vehicles as they move along the road. The motion of these vehicles is tracked over time to provide a consistent view of their time varying distribution on the road ahead. To achieve this the radar estimates each vehicle's range and relative velocity from the microwave signals.

More precisely, distance can be measured from the phase difference that is seen in the returned signal when the emitted signal is modulated by a small step change in frequency as given by:

$$d = \frac{c\phi_s}{4\pi f_s}$$

Where c is the speed of light, $\phi_s$ is the relative phase of the Doppler signals returned by two frequencies separated by $f_s$, the frequency step size. The accuracy of the measurement is related to the frequency step size.

Similarly, the relative velocity can be measured by looking at the Doppler shift between the emitted signal and the received signal as given by the following expression:

$$v = \frac{cf_o}{2f_D}$$

where c is the speed of light, $f_o$ is the carrier frequency and $f_D$ is the Doppler shift.

As the carrier frequency is regulated by a highly accurate resonator in the microwave components, it is very stable and the velocity measurements are highly accurate.

A problem with such apparatus is that variations in the temperature of the microwave frequency generator cause errors in the estimation of the target vehicles distance. This has in the past been solved by providing a heater to regulate the temperature of the frequency generator and in particular to raise its temperature to an ideal or target region in which the temperature co-efficients of the components are linear to allow open loop corrections to be applied to the modulation. A temperature sensor is used to provide the information needed to drive these control circuits.

We have realised that the reliance upon a temperature sensor in a scheme of this type can result in unsatisfactory performance after extended use in harsh environments due to significant ageing effects on the temperature sensor.

BRIEF SUMMARY OF THE INVENTION

According to a first aspect the invention provides a radar-based distance measurement apparatus comprising:

a microwave circuit comprising a frequency generator which produces a microwave frequency signal, the frequency of which is modulated by an amount determined by a modulation signal applied to the frequency generator, a temperature sensor which measures the temperature of at least a part of the microwave circuit, compensating means for processing the output of the temperature sensor to produce a compensated temperature signal using information derived from the drive signal and an echo signal detected by a microwave detector; and a frequency regulating means which is adapted to receive the compensated temperature signal and to regulate the frequency of the signal generated by the frequency generator, thereby at least partially correcting for the effect of changes in temperature of the frequency generator.

Because the compensating means modifies the output of the temperature sensor in a closed loop using information derived from an echo signal, the frequency regulating means can regulate the frequency output by the frequency generator—keeping it as close as possible to an ideal constant value—despite changes in its temperature. Additionally, the compensating means enables the apparatus to correct for the effect of ageing of the temperature sensor or the like. This is not possible in prior art open loop systems in which the output of the temperature sensor is simply assumed to be correct throughout its working life.

The frequency regulating means may comprise a heater which is adapted to heat the frequency generator by an amount dependent upon the value of the compensated temperature signal. It is well known that microwave frequency generators produce a frequency which varies with temperature.

The heater may comprise a resistive heating element. This may be coupled to the oscillator using a thermal matching compound. The corrected temperature may be compared to a reference temperature. If the oscillator is above the reference temperature—as indicated by the corrected temperature value, the heater may be switched off. If below it may be switched on.

Alternatively, the frequency regulating means may modify the modulating signal applied to the frequency generator according to the value of the compensated temperature signal. For example, if the compensated temperature is at or close to an ideal temperature then no modification of the drive signal may be applied, the amount of modification of the modulating signal increasing as the compensated temperature gets further away from the ideal.

Thus, it may alter the size of the frequency steps requested from the frequency generator. This is especially useful if the generator is too hot and above the reference temperature, a condition which cannot be corrected by a heater. In changing the requested step sizes it is possible to cause the generator to produce the correct step sizes in the modulating signal even when temperature causes the frequency generator to work incorrectly.

Of course, the invention may include a combination of heating/cooling and modification of the modulating signal as a way of regulating the frequency output from the frequency generator.

The apparatus may include a first processing means adapted to determine the distance of a target from the apparatus by comparing the phase shift between regions of the modulating signal either side of the step change in frequency and the corresponding regions in an echo signal reflected from the target detected by the detector. A reading may be produced every computational cycle of the radar.

The apparatus may also include a second processing means adapted to determine the relative velocity of the apparatus and the target by measuring the Doppler shift between the modulating signal and an echo signal returned from an object. A reading may be produced every computational cycle of the radar.

A third processing means may determine a first change-in-distance value using the directly obtained distance measurements taken at these two moments in time.

A fourth processing means may be provided which integrates the measured velocity between two different moments in time and from this determines a second change-in-distance value indicative of the change in distance between the radar apparatus and the source of an echo between these two times.

The first, second, third and fourth processing means may form part of a single integrated circuit. Alternatively, the apparatus may include a processor and a memory which stores program instructions that causes the processor to carry out the functions of the first, second, third and fourth processing means.

A comparison means may be provided which is adapted to compare the first and the second change-in-distance values to produce an error value. This may be fed to the compensating means which in turn is adapted to correct the temperature signal output from the temperature sensor by an amount dependent on the magnitude and sign of the error value.

The temperature sensor may comprise, for example, a thermister or a silicon temperature sensor. The temperature sensor may measure the temperature of the oscillator, since the sensitivity of this component to temperature is the main source of errors.

The frequency generating means may comprise an oscillator and may comprise a voltage-controlled oscillator. These are known to be sensitive to temperature changes. It may be provided as an integrated circuit, and the temperature sensor may be embedded within the oscillator.

The apparatus may produce a reported distance value whenever a distance reading is made by the first processing means by combining the reading with the error value produced by the comparator. For example, the error value may be calculated by dividing the first change-in-distance value by the first change-in-distance value. The reported distance could then be formed by multiplying the distance reading from the first processing means by the error value.

The apparatus may include a microwave source which generates a microwave signal when driven by the drive signal, and a microwave detector which produces an echo signal in response to microwave radiation incident upon the detector. They may be provided in a common housing, or may be located separately.

According to a second aspect the invention provides a radar apparatus substantially as described herein with reference to and as described in the accompanying drawings.

Other advantages of this invention will become apparent to those skilled in the art from the following detailed description of the preferred embodiment, when read in light of the accompanying drawings.

DETAILED DESCRIPTION OF THE INVENTION

Figure 1:
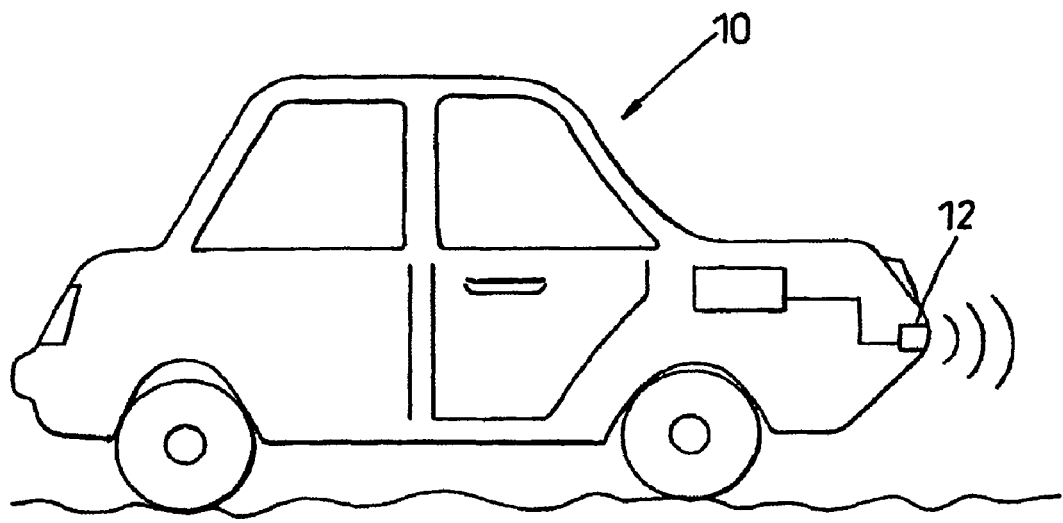
FIG. 1 shows the installation of an apparatus which is in accordance with the present invention on a vehicle.

As shown in FIG. 1, a vehicle 10 is fitted with an example of a radar apparatus in accordance with the present invention. The apparatus comprises a combined microwave source and detector 12. These are mounted towards the front of the vehicle, perhaps at bumper level as shown, where there is a clear and unobstructed (in the microwave range of the spectrum) view ahead of the vehicle as it travels along a road. The source/detector are connected to a processor through a suitable electrical cable.

Figure 3:
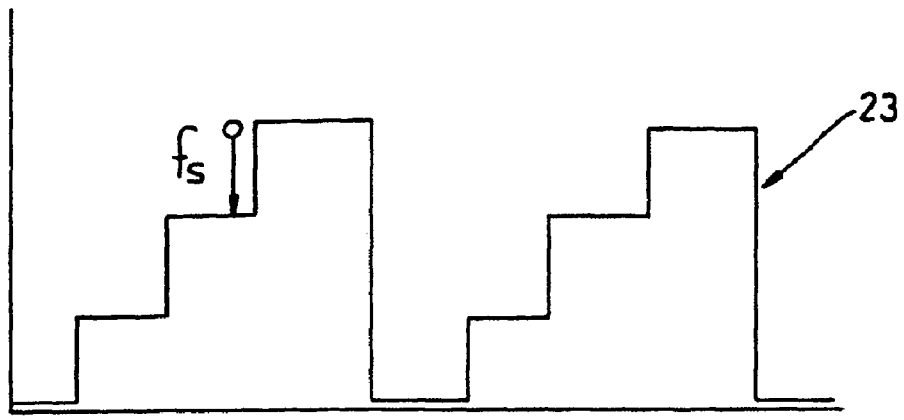
FIG. 3 illustrates a typical FSK drive signal used by the circuit of FIG. 2.
Figure 2:
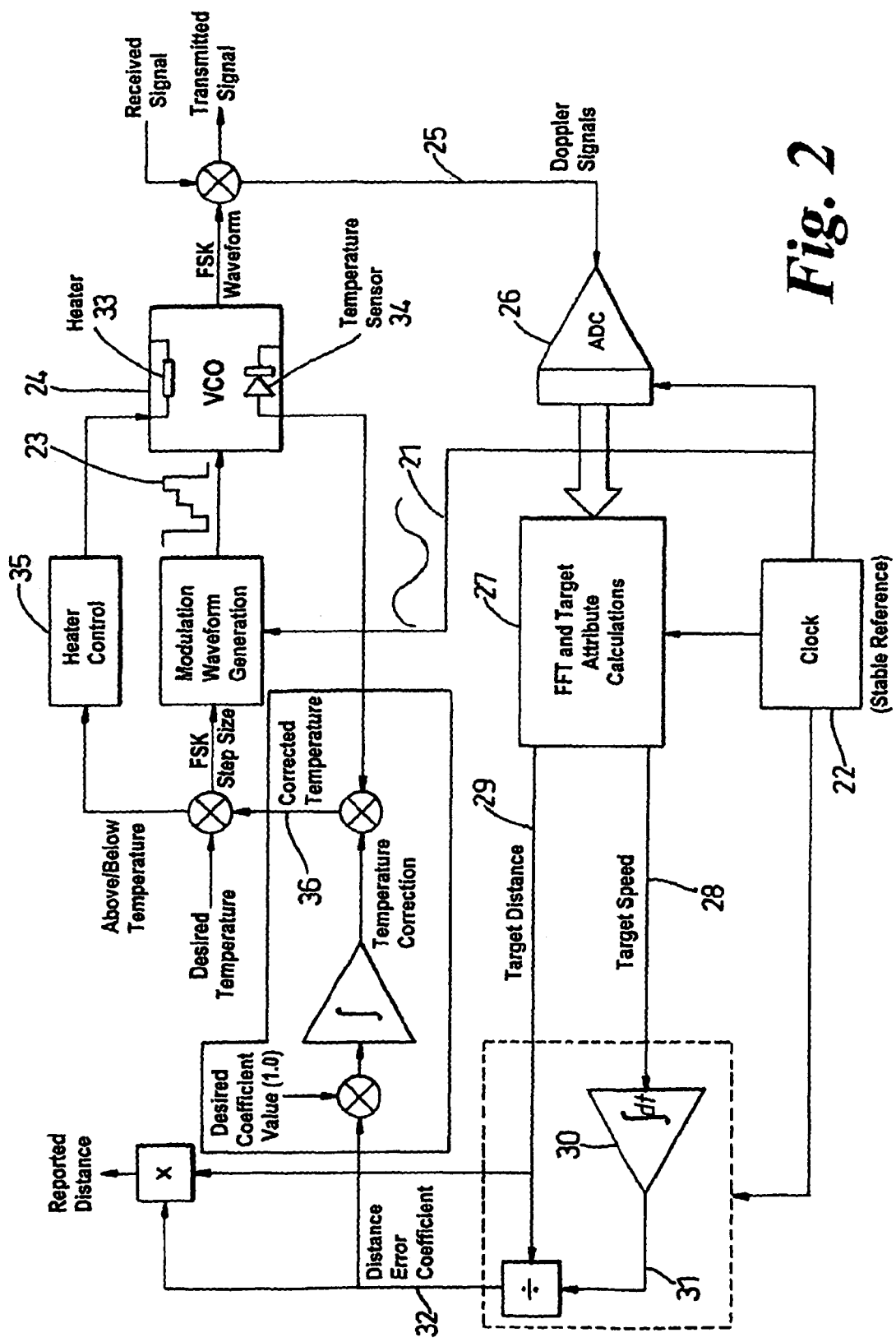
FIG. 2 is a schematic of a radar apparatus in accordance with one embodiment of the present invention.

As shown in FIG. 2 of the accompanying drawings, the source is driven by a stable voltage controlled oscillator (VCO) 24 which is modulated by a drive signal 23. The drive signal is produced by a modulation voltage waveform generator that is synchronised by a clock 22. The difference in frequency of each of the frequency steps $F_s$ produced by the changing voltage of the drive is known as the FSK step size. A typical drive signal 23, in which four steps are present, is shown in FIG. 3 of the accompanying drawings and this voltage signal is applied to the VCO. The source in turn sends out a narrow beam of microwave radiation to the front of the vehicle.

If there is a vehicle in the road in front of the source, a portion of the transmitted signal will be reflected back towards the detector which converts the reflected signal into an electrical signal. The detected echo signal will also be a FSK signal with the four steps. Its strength will depend on the size of the vehicle, how reflective the vehicle is and also how far from the detector it is. In addition, a Doppler shift will be present between the emitted and the received signals which indicates the relative velocity of the vehicle carrying the radar and the vehicle ahead of it on the road. This relative velocity is given by the expression:

$$v = \frac{cf_o}{2f_D}$$

The drive signal and the echo signal may be combined to extract the Doppler signal 25.

Similarly, a phase shift, $\phi_s$ will be present between the Doppler signals produced by each of the frequency steps that are $f_s$ apart and this can be used to determine a distance value according to:

$$d = \frac{c\phi_s}{4\pi f_s}$$

To determine the velocity and the distance the apparatus passes the Doppler signal 25 through an analogue to digital converter (A/D) 26. The output of the A/D 26 is then fed to a digital signal processor (DSP) 27 together with a reference signal from the clock 21. The DSP 27 generates a target velocity signal 28 which changes over time as the velocity changes and a distance signal 29.

The target velocity signal 28 passes to an integrator 30 which integrates the velocity over time to determine a first change-in-distance over time value 31. This is then compared with the change in distance estimated "directly" using the distance output 29 of the DSP 27. The ratio of the "direct" estimate to the integrated estimate is used to form an error correction coefficient 32. Whenever distance is reported from the radar—which is produced in real time using the direct output signal 29 based on the FSK phase shift, the correction is applied so as to keep the reported distance accurate.

The increased accuracy is achieved because the velocity measurement 28 is not affected by temperature to the same extent as the direct distance measurement 29. It is known that the main error in the direct distance measurement is the effects of temperature on the microwave components, and in particular the VCO 24. The Doppler based velocity measurement is dependent on the base frequency of the VCO which is controlled by a ceramic resonator.

Clearly, it is best to keep the frequency step constant throughout the life of the radar; i.e. the distance error coefficient should be as small as possible. Therefore, to reduce the effects of temperature drift a heater 33 is provided within the VCO module and a temperature sensor 34 is provided which measures the temperature of the VCO module. The output of the temperature sensor 34 is passed to a heater controller 35 and the controller applies a voltage to the heater 33 until the measured temperature is within a target range.

Before the output of the temperature sensor 33 is passed to the heater controller 35 it is corrected by subtracting a compensation value that is dependent upon the error correction coefficient 32 applied to the reported distance values.

The correction of the temperature value ensures that drift of the temperature sensor with age is compensated for. The output from the temperature sensor is no longer assumed to be correct, and it is possible to compensate for changes in the temperature sensor's characteristics over time. Also, since the heater 33 will do its best to keep the temperature of the VCO 24 in the ideal range the magnitude of the correction that must be applied to the "direct" distance measurements will tend towards an ideal unitary value over time.

In accordance with the provisions of the paten statues, the principle and mode of operation of this invention have been explained and illustrated in its preferred embodiments. However, it must be understood that this invention may be practiced otherwise than as specifically explained and illustrated without departing from its spirit or scope.

What is claimed is:

1. A radar-based distance measurement apparatus comprising:
    a microwave circuit comprising a frequency generator which produces a microwave frequency signal having a frequency which is modulated by an amount determined by a modulation signal applied to said frequency generator,
    a temperature sensor which outputs a temperature measurement of at least a part of said microwave circuit,
    a compensator for compensating for errors in said output of said temperature sensor due to aging effects of said temperature sensor to produce a compensated temperature signal using information derived from said drive signal and an echo signal detected by a microwave detector; and
    a frequency regulator which is adapted to receive said compensated temperature signal and to regulate said frequency of said signal generated by said frequency generator, thereby at least partially correcting for the effect of changes in temperature of the frequency generator.

2. A radar apparatus according to claim 1 wherein said frequency regulator comprises a heater which is adapted to heat said frequency generator by an amount dependent upon a value of said compensated temperature signal.

3. A radar apparatus according to claim 1 wherein said frequency regulator modifies said modulating signal applied to said frequency generator according to a value of said compensated temperature signal.

4. Apparatus according to claim 1 which further includes a first processing means adapted to determine the relative velocity of the apparatus and said target by measuring a Doppler shift between said drive signal and an echo signal returned from said target.

5. Apparatus according to claim 4 which includes a second processing means adapted to determine a distance of said target from the apparatus by comparing a phase shift between regions of said drive signal either side of a step change in frequency and corresponding regions present in an echo signal that is reflected from said target and detected by said detector.

6. Apparatus according to claim 5 further including a third processing means which integrates a velocity between two different moments in time and from this determines a first change-in-distance value indicative of a change in distance between the apparatus and a source of an echo between these two times.

7. Apparatus according to claim 6 further including a fourth processing means which determines a second change-in-distance value using directly obtained distance measurements taken at said two moments in time.

8. Apparatus according to claim 7 wherein said first, second, third and fourth processing means form part of a single integrated circuit.

9. Apparatus according to claim 7 wherein the apparatus includes a processor and a memory which stores program instructions that cause said processor to carry out the functions of said first, second, third and fourth processing means.

10. Apparatus according to claim 7 which further includes a comparator which is adapted to compare said first and said second change-in-distance values to produce an error value, and to feed said error value to said compensating means which is adapted to correct said temperature signal output from said temperature sensor by an amount dependent on a magnitude and sign of said error value.

11. Apparatus according to claim 8 which is adapted to produce a reported distance value whenever a distance reading is made by said first processing means by combining said distance reading with said error value produced by said comparator.

* * * * *